United States Patent
Delano et al.

(10) Patent No.: US 10,698,458 B2
(45) Date of Patent: Jun. 30, 2020

(54) INTEGRATED VAPOR CHAMBER FOR THERMAL MANAGEMENT OF COMPUTING DEVICES

(71) Applicant: Microsoft Technology Licensing, LLC, Redmond, WA (US)

(72) Inventors: Andrew Delano, Woodinville, WA (US); Taylor Stellman, Seattle, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 97 days.

(21) Appl. No.: 14/294,040

(22) Filed: Jun. 2, 2014

(65) Prior Publication Data

US 2015/0346784 A1    Dec. 3, 2015

(51) Int. Cl.
| | | |
|---|---|---|
| *G06F 1/20* | (2006.01) | |
| *F28D 15/02* | (2006.01) | |
| *H01L 23/427* | (2006.01) | |
| *G06F 1/16* | (2006.01) | |

(52) U.S. Cl.
CPC ......... *G06F 1/203* (2013.01); *F28D 15/0233* (2013.01); *F28D 2015/0216* (2013.01); *G06F 1/1626* (2013.01); *G06F 2200/201* (2013.01); *H01L 23/427* (2013.01); *H01L 2924/0002* (2013.01)

(58) Field of Classification Search
CPC ......................... G06F 1/203; F28D 2015/0216
See application file for complete search history.

(56) References Cited

U.S. PATENT DOCUMENTS

| 6,504,721 B1 | 1/2003 | Watwe et al. |
|---|---|---|
| 9,307,682 B2 * | 4/2016 | Fujieda .................. G06F 1/203 |
| 9,310,139 B2 * | 4/2016 | Vadakkanmaruveedu ................... F28D 15/02 |

(Continued)

FOREIGN PATENT DOCUMENTS

| CN | 2726115 Y | 9/2005 |
|---|---|---|
| CN | 2727829 Y | 9/2005 |

(Continued)

OTHER PUBLICATIONS

Demerjian, "CCI makes 2mm thick Ultrabook Vapor Chamber. TFE 2011: Miracles of engineering can't save a bad idea", Nov. 22, 2011.

(Continued)

*Primary Examiner* — Robert J Hoffberg
(74) *Attorney, Agent, or Firm* — Ray Quinney & Nebeker P.C.; Paul N. Taylor (57) ABSTRACT

A vapor chamber may be integrated with one or more components of a computing device to provide thermal management. The vapor chamber may include upper and lower portions forming the vapor chamber, and an annular space between the upper and lower portions that includes a fluid. The vapor chamber may be configured to absorb heat from a heat source of the computing device. Subsequently, the uniform heat transfer may enable the external surfaces of the computing device to achieve substantially isothermal external surface conditions, which may maximize a power dissipation of the computing device for a given ambient temperature ensuring a temperature of the computing device remains at or below safe limits while in use.

18 Claims, 8 Drawing Sheets

(56) References Cited

U.S. PATENT DOCUMENTS

| | | | |
|---|---|---|---|
| 9,547,344 B2* | 1/2017 | Han | G06F 1/203 |
| 9,569,024 B2* | 2/2017 | Wu | G06F 3/041 |
| 9,720,548 B2 | 8/2017 | Powell | |
| 9,836,100 B2* | 12/2017 | Han | G03B 17/55 |
| 10,019,046 B2* | 7/2018 | Shen | G06F 1/203 |
| 10,321,615 B2* | 6/2019 | Stellman | H05K 7/2099 |
| 10,451,356 B2* | 10/2019 | Stellman | H05K 7/20336 |
| 2002/0149924 A1 | 10/2002 | Falicoff et al. | |
| 2005/0111189 A1* | 5/2005 | Smalc | G06F 1/182 |
| | | | 361/700 |
| 2008/0185128 A1* | 8/2008 | Moon | F28D 15/0233 |
| | | | 165/104.26 |
| 2009/0151905 A1* | 6/2009 | Lai | F28D 15/04 |
| | | | 165/104.26 |
| 2010/0101763 A1* | 4/2010 | Huang | F28D 15/0233 |
| | | | 165/104.27 |
| 2010/0149755 A1* | 6/2010 | Tomioka | F28D 15/043 |
| | | | 361/700 |
| 2012/0118537 A1* | 5/2012 | Kameoka | F28D 15/0233 |
| | | | 165/104.26 |
| 2012/0120678 A1 | 5/2012 | Su | |
| 2012/0134139 A1 | 5/2012 | Jang et al. | |
| 2012/0169791 A1 | 7/2012 | Whitehead et al. | |
| 2012/0224388 A1 | 9/2012 | Lin | |
| 2012/0307453 A1* | 12/2012 | Yan | H01L 23/427 |
| | | | 361/704 |
| 2013/0069985 A1* | 3/2013 | Wong | G02B 27/017 |
| | | | 345/633 |
| 2013/0098582 A1* | 4/2013 | Stark | F28D 15/04 |
| | | | 165/104.26 |
| 2014/0092554 A1* | 4/2014 | Yamaguchi | G06F 1/203 |
| | | | 361/692 |
| 2014/0139454 A1* | 5/2014 | Mistry | G06F 3/041 |
| | | | 345/173 |
| 2014/0139637 A1* | 5/2014 | Mistry | H04N 5/2252 |
| | | | 348/46 |
| 2014/0334100 A1* | 11/2014 | Yoon | H05K 7/20145 |
| | | | 361/692 |
| 2014/0352926 A1 | 12/2014 | Sun et al. | |
| 2015/0075186 A1* | 3/2015 | Prajapati | G06F 1/20 |
| | | | 62/3.7 |
| 2015/0077929 A1* | 3/2015 | Honmura | G06F 1/203 |
| | | | 361/679.52 |
| 2015/0119111 A1* | 4/2015 | Honmura | G06F 1/203 |
| | | | 455/566 |
| 2015/0378515 A1 | 12/2015 | Powell | |

FOREIGN PATENT DOCUMENTS

| | | |
|---|---|---|
| CN | 1878451 A | 12/2006 |
| CN | 101663633 A | 3/2010 |
| CN | 102811589 A | 12/2012 |
| CN | 103424020 A | 12/2013 |
| DE | 202013007703 U1 | 11/2013 |
| EP | 1055872 A1 | 11/2000 |
| GB | 2431001 A | 4/2007 |
| JP | 2000002493 A | 1/2000 |
| JP | 2001230578 A | 8/2001 |
| JP | 2002076224 A | 3/2002 |
| JP | 2002286380 A | 10/2002 |
| JP | 2011102691 A | 5/2011 |
| JP | 2014041553 A | 3/2014 |
| JP | 2014098530 A | 5/2014 |
| RU | 2297661 C2 | 4/2007 |
| RU | 100587 U1 | 12/2010 |
| WO | 0250590 A1 | 6/2002 |
| WO | 2014077081 A1 | 5/2014 |
| WO | 2015119366 A1 | 8/2015 |

OTHER PUBLICATIONS

Mujtaba, "Cooler Master announces further integration of Vapor Chambers into it's retail Heatsinks", p. 1-9, retrieved on Mar. 19, 2014.

Kota, "Design and Experimental Study of an Integrated Vapor Chamber-Thermal Energy Storage System", Dissertation submitted for the degree of Doctor of Philosophy in Mechanical Engineering, p. 1-139, 2008.

Meyer, "Integrating Vapor Chambers into Thermal Solutions", Heat Sinks, p. 1-7, Apr. 2010.

"Pureoverclock: PC Hardware reviews and News for overclockers!", PUREOC, p. 1-16, retrieved Mar. 19, 2014.

Wei et al., "Modeling of Vapor Chamber as Heat Spreading Devices", p. 578-585, Thermal and Thermomechanical Phenomena in Electronics Systems, ITHERM '06, May 30, 2006-Jun. 2, 2006.

Mehl, "Vapor Chamber Heat Sinks Eliminate Power Conductor Hot Spots", Power Electronics, p. 1-3, Aug. 1, 2010.

"International Search Report & Written Opinion Issued in PCT Application No. PCT/US2015/033101", dated Aug. 27, 2015, 14 Pages.

"Thermal-Fluids Pedia Vapor Chamber Thermal-Fluids Central", Published on: Mar. 13, 2014, Available at: http://www.thermalfluidscentral.org/encyclopedia/index.php/Vapor_Chamber.

Mohapatra, Satish C., "An Overview of Liquid Coolants for Electronics Cooling", Published on: May 1, 2006, Available at: http://www.electronics-cooling.com/2006/05/an-overview-of-liquid-coolants-for-electronics-cooling/.

"Second Written Opinion Issued in PCT Application No. PCT/US2015/033101", dated Apr. 18, 2016, 10 Pages.

"Final Office Action Issued in U.S. Appl. No. 14/316,802", dated Sep. 6, 2016, 21 Pages.

"Non-Final Office Action Issued in U.S. Appl. No. 14/316,802", dated Jul. 8, 2016, 17 Pages.

"Non-Final Office Action Issued in U.S. Appl. No. 14/316,802", dated Dec. 2, 2016, 22 Pages.

"Office Action Issued in Chinese Patent Application No. 201580029494.9", dated Oct. 24, 2018, 12 Pages.

"Office Action Issued in Chile Application No. 2995-2016", dated May 17, 2018, 11 Pages.

"Office Action Issued in Chile Patent Application No. 2995-2016", dated Sep. 13, 2018, 10 Pages.

NC2016/0005608, "Office Action Issued in Colombian Patent Application No. NC2016/0005608", dated Aug. 23, 2017, 14 Pages.

"International Preliminary Report on Patentability Issued in PCT Application No. PCT/US2015/033101", dated Sep. 2, 2016, 11 Pages.

"International Preliminary Report on Patentability Issued in PCT Application No. PCT/US2015/036859", dated Oct. 7, 2016, 8 Pages.

"International Search Report & Written Opinion Issued in PCT Application No. PCT/US2015/036859", dated Dec. 22, 2015, 17 Pages.

"Second Written Opinion Issued in PCT Application No. PCT/US2015/036859", dated May 6, 2016, 7 Pages.

"Office Action Issued in Russian Patent Application No. 2016147187", dated Dec. 14, 2018, 10 Pages.

"Office Action Issued in Philippines Patent Application No. 1-2016-502202", dated Mar. 15, 2019, 5 Pages.

"Office Action Issued in Chinese Patent Application No. 201580029494.9", dated Apr. 1, 2019, 15 Pages.

"Office Action Issued in Japanese Patent Application No. 2016-567926", dated Apr. 2, 2019, 8 Pages.

"Office Action Issued in Australian Patent Application No. 2015271054", dated Apr. 27, 2019, 3 Pages.

"Office Action Issued in Chinese Patent Application No. 201580029494.9", dated Jul. 10, 2019, 7 Pages.

"Office Action Issued in Philippines Patent Application No. 1-2016-502202", dated Jul. 15, 2019, 4 Pages.

"Notice of Allowance Issued in European Patent Application No. 15729653.4", dated Jun. 27, 2019, 7 Pages.

"Office Action Issued in Philippines Patent Application No. 1-2016-502202", dated Oct. 10, 2019, 4 Pages.

"Office Action Issued in Japanese Patent Application No. 2016-567926", dated Dec. 3, 2019, 5 Pages.

(56) References Cited

OTHER PUBLICATIONS

"Office Action Issued in Brazilian Patent Application No. BR112016027597-7", dated Jan. 16, 2020, 5 Pages.

* cited by examiner

INTEGRATED VAPOR CHAMBER FOR THERMAL MANAGEMENT OF COMPUTING DEVICES

SUMMARY

This summary is provided to introduce a selection of concepts in a simplified form that are further described below in the Detailed Description. This summary is not intended to exclusively identify key features or essential features of the claimed subject matter, nor is it intended as an aid in determining the scope of the claimed subject matter.

According to some implementations, methods to provide thermal management for a computing device are described. An example method may include integrating a fluid-filled vapor chamber into one or more components of the computing device, where the vapor chamber includes an upper portion, a lower portion, and an annular space between the upper and lower portions that comprises the fluid.

These and other features and advantages will be apparent from a reading of the following detailed description and a review of the associated drawings. It is to be understood that both the foregoing general description and the following detailed description are explanatory and do not restrict aspects as claimed.

DETAILED DESCRIPTION

A mobile computing device, such as a cell phone, tablet, laptop, wearable device, or gaming device, may be frequently handled and touched by one or more users of the device. Accordingly, the device may be designed so it remains at or below safe temperature limits while in use. If the device exceeds the safe temperature limits, the performance of the device may be reduced or the device may be shutdown preventing further use.

In standard computing devices, the devices are passively cooled to moderate temperature by transferring heat through natural forces such as convection, conduction, and radiation to one or more outside surfaces of the device. In some devices, the convection may be both natural and forced by using a fan or blower, for example, to extend a surface area of the heat transfer. However, the heat transfer resulting from these techniques, may not be uniform throughout the device causing a temperature gradient to develop on the outside surfaces of the device. The temperature gradient may prevent the device from maximizing a power dissipation of the device, leaving the device vulnerable to reductions in performance and/or shutdowns.

Implementations are directed to a vapor chamber integrated with one or more components of a computing device to provide thermal management. The one or more components may include a touch display module (TDM) or a back case, for example. The vapor chamber may include upper and lower portions forming the vapor chamber, and an annular space between the upper and lower portions that includes a fluid. The vapor chamber may be configured to absorb heat from the computing device, and enable uniform heat transfer to one or more external surfaces of the computing device. The uniform heat transfer may enable the external surfaces of the computing device to achieve substantially isothermal external surface conditions, which may maximize a power dissipation of the computing device for a given ambient temperature.

For example, the fluid may evaporate in response to an increase in temperature caused by the absorbed heat, which may optimize a dynamic viscosity and a thermal conductivity of the fluid. Optimization of such transport properties may enable uniform heat transfer to one or more external surfaces of the device.

In the following detailed description, references are made to the accompanying drawings that form a part hereof, and in which are shown by way of illustrations specific implementations or examples. These aspects may be combined, other aspects may be utilized, and structural changes may be made without departing from the spirit or scope of the present disclosure. The following detailed description is therefore not to be taken in a limiting sense, and the scope of the present invention is defined by the appended claims and their equivalents.

Figure 1:
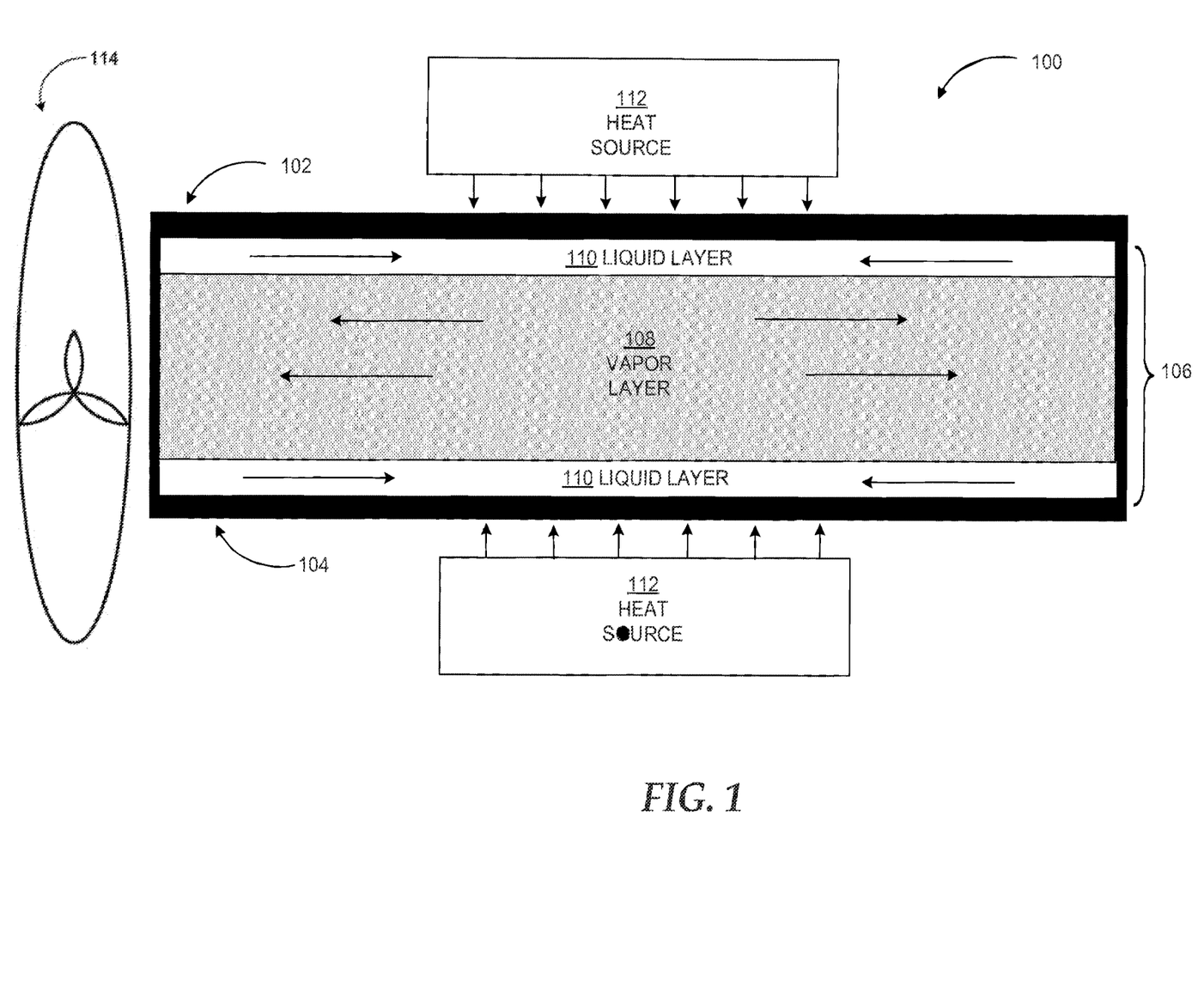
FIG. 1 illustrates an example cross section of a vapor chamber that may be integrated with one or more components of a computing device to provide thermal management.

FIG. 1 illustrates an example cross section of a vapor chamber that may be integrated with one or more components of a computing device to provide thermal management.

In diagram 100, an example vapor chamber may include an upper portion 102, a lower portion 104, and an annular space 106 between the upper and lower portions. The annular space 106 may include a fluid that may be present in one or more phases dependent on an ambient temperature. A type of the fluid may be dependent on a material of the vapor chamber. For example, if the vapor chamber is composed of aluminum, the fluid may be acetone. In some examples, the vapor chamber may be integrated with one or more components of a mobile computing device, such as a smart phone, tablet, laptop, and gaming device. In some examples, the vapor chamber may be integrated such that it spans at least one dimension of the computing device components. In other implementations, the vapor chamber may be smaller than the dimensions of the computing device. In one implementation, the vapor chamber may be integrated with a touch display module (TDM) of the computing device. In another implementation, the vapor chamber may be integrated with a back case of the computing device.

The vapor chamber may absorb heat from a heat source 112 of the computing device, such as a printed circuit board, causing the fluid in the annular space 106 to change phases. For example, the fluid may be a liquid contained within one or more liquid layers 110 of the annular space 106. In response to the absorbed heat, a temperature of the vapor chamber may increase and a portion of the fluid may evaporate causing the fluid to become vapor contained within a vapor layer 108 of the annular space 106. As illustrated, the vapor layer 108 may be surrounded by the liquid layers 110. Once the heat has been transferred from the vapor chamber to one or more external surfaces of the computing device, and thus the temperature of the vapor chamber has decreased, a portion of the fluid in the vapor phase may condensate causing the fluid to become a liquid again. The vapor chamber may utilize these phase changes of the fluid to optimize transport properties enabling a uniform heat transfer to the external surfaces of the computing device.

The transport properties optimized to enable the uniform heat transfer may include a dynamic viscosity and a thermal conductivity of the fluid, for example. Dynamic viscosity is a measure of a resistance of a fluid to deformation under shear stress. The dynamic viscosities of liquids may be typically several orders of magnitude higher than dynamic viscosities of gases or vapors. Thus, as the fluid evaporates from a liquid to a vapor in response to the increased temperature, the viscosity of the fluid decreases causing less resistance and therefore more optimal transport. Thermal conductivity is a property of a fluid to conduct heat that may be altered in response to a phase change of the fluid. For example, as the fluid is evaporated from a liquid to a vapor, the thermal conductivity decreases. Heat transfer may occur at an increased rate across fluids of higher thermal conductivity than across fluids of lower thermal conductivity, thus enabling a more uniform transfer of the heat as the fluid changes phase from a liquid to a vapor. In some examples, a change to the surface tension of the fluid in response to the phase change may also contribute to the enablement of uniform heat transfer. Surface tension is a temperature dependent, contractive tendency of a surface of a liquid that allows the liquid to resist an external force. For example, surface tension causes molecules of the fluid to be more attracted to one another than to an external force, which leads to a minimization of surface area of the fluid. As temperature increases, the molecules become more energized and less attracted to one another and thus, surface tension may decrease. The decrease in surface tension combined with the increase in temperature may lead to an increase in the evaporation rate, which may in turn physically increase the rate of the uniform heat transfer.

In some implementations, the rate of the uniform heat transfer may be mechanically altered. In one example, the rate of the heat transfer may be increased by forcing air over the external surfaces of the computing device using a fan or a blower. In another example, the rate of the heat transfer may be increased by positioning a heat sink on the one or more external surfaces of the computing device, where the heat sink may be configured to dissipate heat from the external surfaces of the computing device into an ambient environment.

The uniform heat transfer may enable the external surfaces of the computing device to achieve substantially isothermal external surface conditions that will maximize a power dissipation of the computing device for a given ambient temperature. Maximized power dissipation may ensure the computing device remains at or below safe temperature limits while in use, preventing performance reductions or a shutdown of the computing device.

The example vapor chamber in FIG. 1 has been described with specific components, component configurations, and component tasks. Implementations are not limited to the vapor chamber according to this example. An integrated vapor chamber configured to provide thermal management for a computing device may be implemented in configurations employing fewer or additional components, and performing other tasks. Furthermore, an integrated vapor chamber configured to provide thermal management for a computing device may be implemented in a similar manner using the principles described herein.

Figure 2:
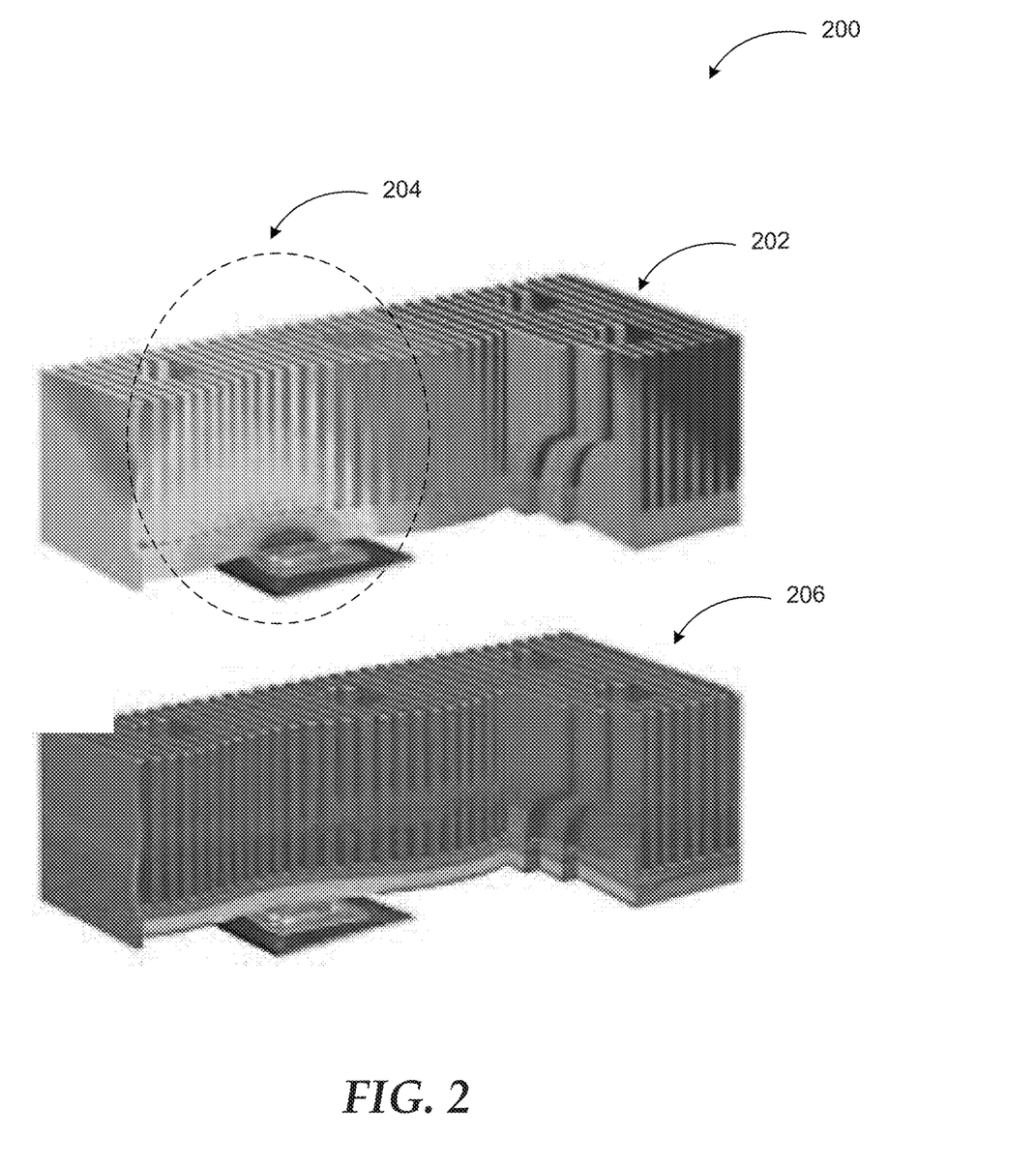
FIG. 2 includes an example thermal diagram to illustrate heat transfer within a computing device integrated with a vapor chamber.

FIG. 2 includes an example thermal diagram to illustrate heat transfer within a computing device integrated with a vapor chamber.

In diagram 200, a first configuration 202 illustrates a distribution of heat from a heat source within a computing device prior to absorption of the heat by a vapor chamber integrated with one or more components of the computing device. The heat may be briefly sequestered within a portion 204 of the device proximal to the heat source, causing a temperature gradient on the outside surfaces of the device to develop. For example, external surfaces proximal to the portion 204 of the device proximal to the heat source may be substantially higher in temperature than the external surfaces of other portions of the device. The first configuration 202 may also be indicative of total heat transferring capabilities of standard computing devices, where the heat transfer is non-uniform throughout the devices causing temperature gradients to develop on the external surfaces of the standard computing devices. These temperature gradients may reduce performance of the device and/or cause the device to shut down.

The integrated vapor chamber may be configured to absorb the heat, such that the heat is transferred uniformly to dispel undesirable temperature gradients, as illustrated in a second configuration 206. The vapor chamber may include a fluid that may change phases in response to the absorbed heat. For example, the fluid may initially be a liquid. In response to the absorbed heat, a temperature of the vapor chamber may be increased, and a portion of the fluid may evaporate causing the fluid to become vapor. Once the heat has been transferred from the vapor chamber to the external surfaces of the computing device, the temperature of the vapor chamber may decrease, and a portion of the fluid in the vapor phase may condensate causing the fluid to become a liquid again. The uniform heat transfer may enable the external surfaces of the computing device to achieve substantially isothermal external surface conditions, which may maximize a power dissipation of the computing device for a given ambient temperature.

Figure 3:
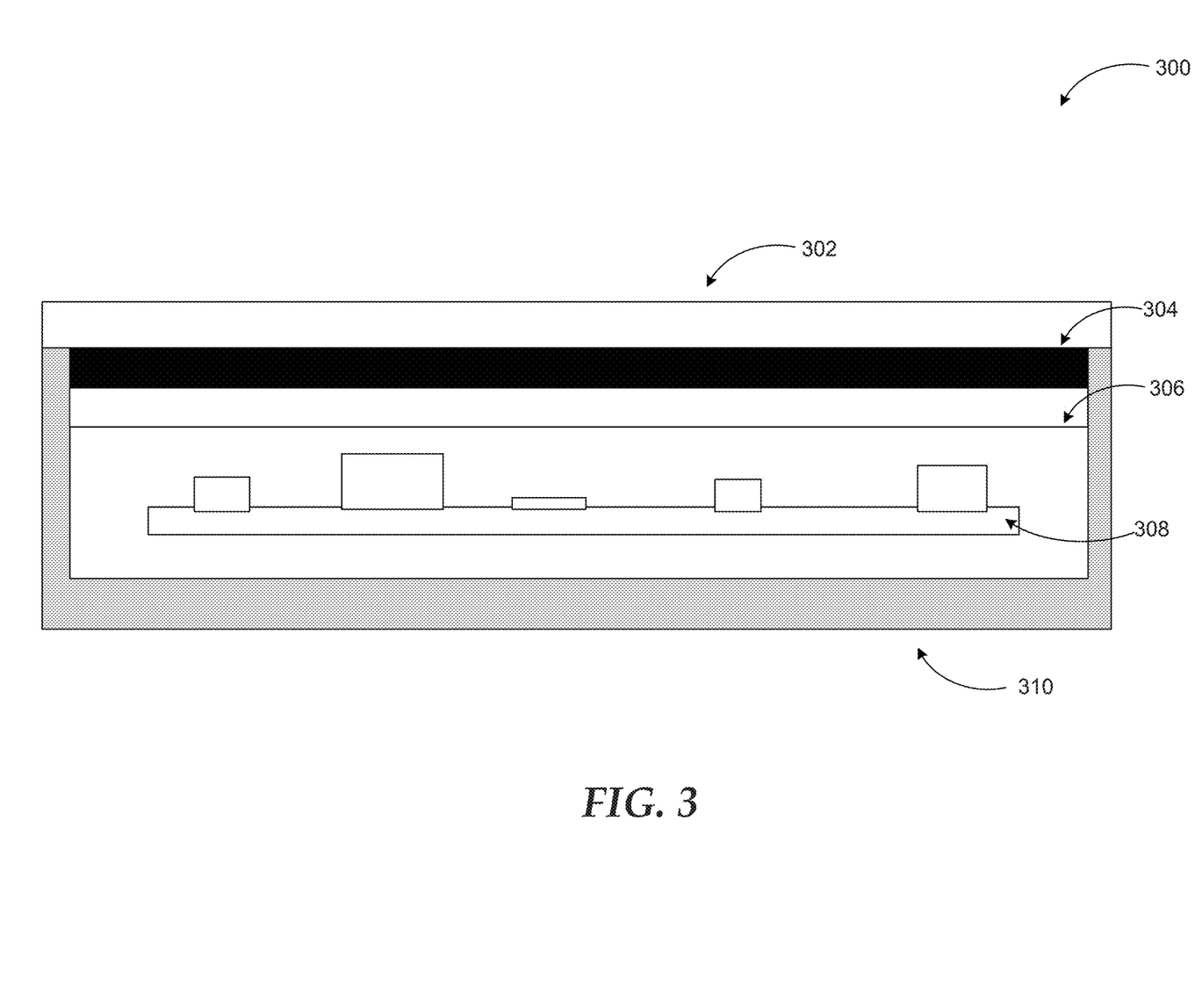
FIG. 3 illustrates an example vapor chamber integrated with a touch display module (TDM) of a computing device.

FIG. 3 illustrates an example vapor chamber integrated with a touch display module (TDM) of a computing device.

In diagram 300, an example computing device, such as a tablet, smartphone, or smart watch, may include a touch display 302, a TDM 304, a vapor chamber 306, a heat source 308 (for example, a printed circuit board), and a back case 310, among other components. The touch display 302 may be a user interface, for example, that enables a user to interact with the computing device through simple or multi-touch gestures by touching the screen with a special stylus or pen and/or one or more fingers. In other examples, traditional methods of input such as a keyboard, a mouse, and/or a touchpad input may also be used to interact with the computing device. The TDM 304 may provide functionality to the touch display 302 and may include a piece of metal, such as aluminum, spanning a back side of the TDM 304 that an upper portion of the vapor chamber 306 may replace. The vapor chamber 306 may include an upper portion and a lower portion that form the vapor chamber 306, where the upper and lower portions may be composed of aluminum, for example. The upper portion of the vapor chamber 306 may be coupled to the TDM 304 and the lower portion of the vapor chamber 306 may be coupled to the heat source 308. The vapor chamber 306 may also include an annular space between the upper and lower portions that includes a fluid, such as acetone or water. The back case 310 may be configured to structurally contain computational components within the computing device.

The vapor chamber 306 may be configured to absorb heat from the heat source 308 causing the fluid in the annular space of the vapor chamber 306 to change phases. For example, the fluid may initially be a liquid. In response to the heat, a temperature of the vapor chamber 306 may increase and a portion of the fluid may evaporate causing the fluid to become vapor. Once the heat has been transferred from the vapor chamber 306, the temperature of the vapor chamber 306 may decrease and a portion of the fluid in the vapor phase may condensate causing the fluid to become a liquid again.

When integrated with the TDM 304, the vapor chamber 306 may be further configured to maintain a maximum z-axis (depth) thermal resistance due to the location of the TDM 304. For example, the TDM 304 may be located in a middle section of the computing device proximal to where the most heat is produced, enabling the heat transfer to be even more efficient and uniform.

The uniform heat transfer may enable the external surfaces of the computing device to achieve substantially isothermal external surface conditions, which may maximize a power dissipation of the computing device for a given ambient temperature. Maximized power dissipation may ensure the computing device remains at or below safe temperature limits while in use, preventing performance reduction or a shutdown of the computing device. The uniform heat transfer may be advantageously applied in wearable devices because the wearable nature of such a device means that the device is in near-constant contact with a user, and should be maintained at a safe temperature during operation.

Figure 4:
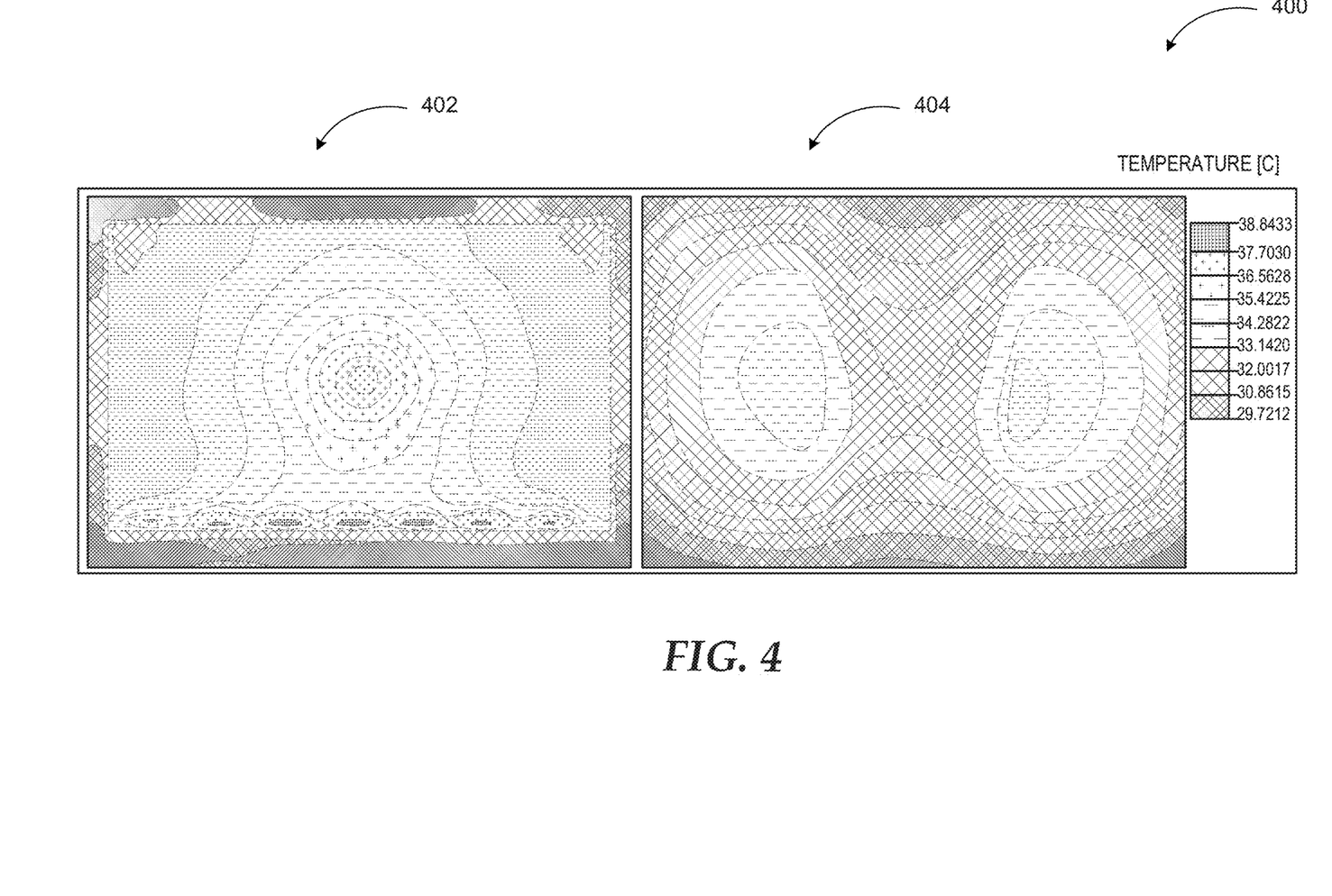
FIG. 4 illustrates example temperature maps for a vapor chamber integrated with a TDM of a computing device.

FIG. 4 illustrates example temperature maps for a vapor chamber integrated with a TDM of a computing device.

In diagram 400, a first temperature map 402 illustrates a display view of a computing device with a TDM integrated vapor chamber, and a second temperature map 404 illustrates a back case view of the same computing device. The TDM may provide functionality to a touch display of the computing device, and may include a piece of metal spanning a back side of the TDM that an upper portion of the vapor chamber may replace. The vapor chamber may include the upper portion and a lower portion forming the vapor chamber, where the upper portion of the vapor chamber may be coupled to the TDM and the lower portion of the vapor chamber may be coupled to a heat source of the computing device. The vapor chamber may also include an annular space between the upper and lower portions that includes a fluid.

The TDM, and therefore the integrated vapor chamber, may be located in a middle section of the computing device proximal to where the most heat is produced, illustrated by a centrally located high temperature area of the first temperature map 402. Due to the location, the vapor chamber may be configured to maintain a maximum z-axis thermal resistance enabling even more efficient and uniform heat transfer once the heat is initially absorbed.

As heat from the heat source is absorbed by the vapor chamber, the fluid in the annular space of the vapor chamber may change phases from a liquid to a vapor, for example, due to an increase in temperature within the vapor chamber.

The uniform heat transfer may enable the external surfaces of the computing device to achieve substantially isothermal external surface conditions that may maximize a power dissipation of the computing device for a given ambient temperature. Maximized power dissipation may ensure the computing device remains at or below safe temperature limits while in use, preventing performance reductions or a shutdown of the computing device.

Figure 5:
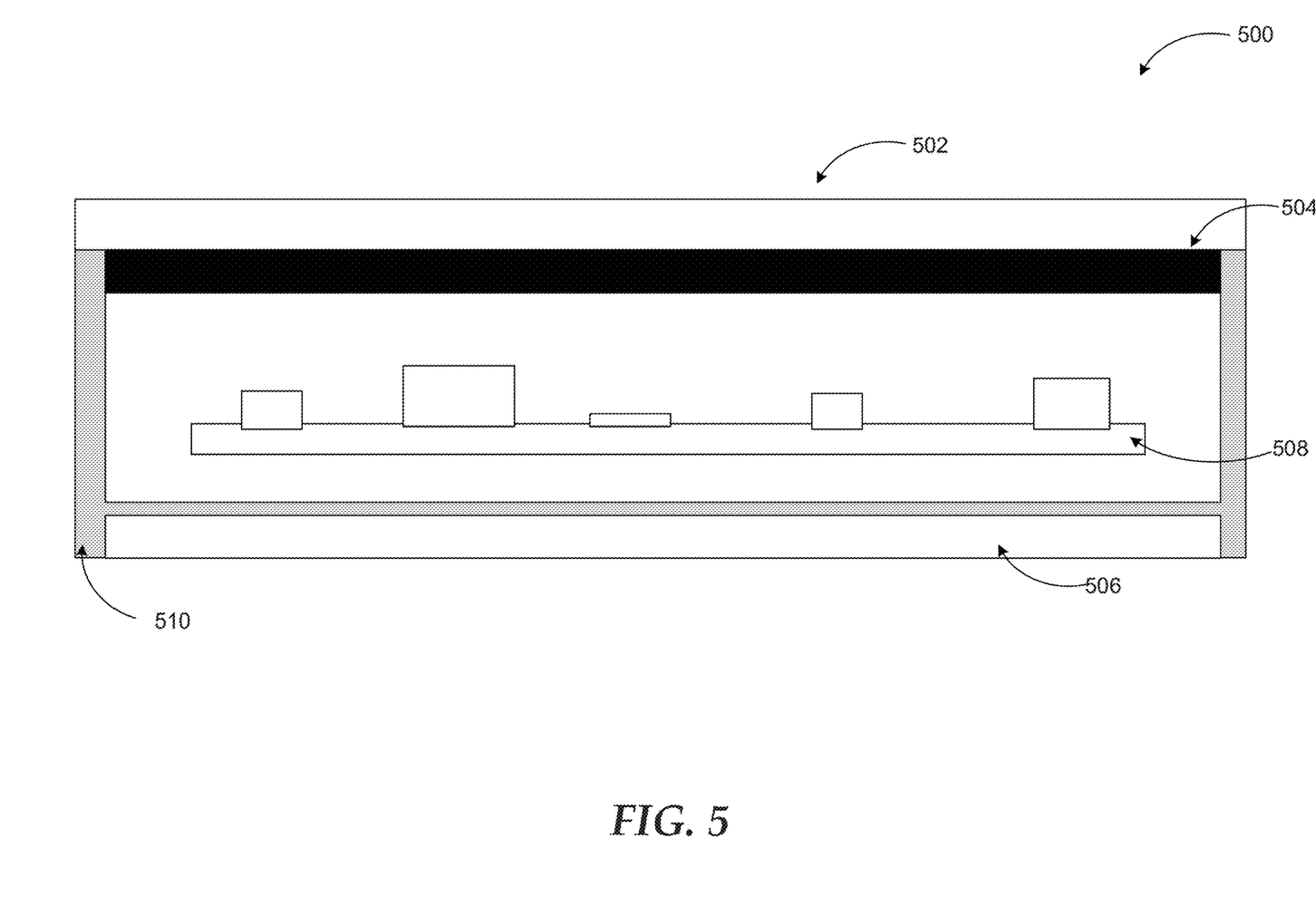
FIG. 5 illustrates an example vapor chamber integrated with a back case of a computing device.

FIG. 5 illustrates an example vapor chamber integrated with a back case of a computing device;

In diagram 500, an example computing device, such as a tablet, may include a touch display 502, a TDM 504, a vapor chamber 506, a heat source 508 (for example, a printed circuit board), and a back case 510, among other components. The touch display 502 may be a user interface, for example, that enables a user to interact with the computing device through simple or multi-touch gestures by touching the screen with a special stylus or pen and/or one or more fingers. In other examples, traditional methods of input such as a keyboard, a mouse, and/or a touchpad input may also be used to interact with the computing device. The TDM 504 may provide functionality to the touch display 502. The back case 510 may be configured to structurally contain computational components within the computing device, where an external surface of the back case 510 may be at least one external surface of the computing device. The vapor chamber 506 may include an upper portion and a lower portion that are bound though diffusion to form the vapor chamber 506. The upper portion of the vapor chamber 506 may be a metal, such as aluminum, coupled to the heat source 508, and the lower portion of the vapor chamber 506 may be a portion of the back case 510. The vapor chamber 506 may also include an annular space between the upper and lower portions that is evacuated and charged with a fluid following the formation of the vapor chamber 306.

The vapor chamber 506 may be configured to absorb heat from the heat source 508 causing the fluid in the annular space of the vapor chamber 506 to change phases. For example, the fluid may initially be a liquid. In response to the absorbed heat, a temperature of the vapor chamber 506 may increase, and a portion of the fluid may evaporate causing the fluid to become vapor. Once the heat has been transferred from the vapor chamber 506 to one or more external surfaces of the computing device, the temperature of the vapor chamber 506 may decrease, and a portion of the fluid in the vapor phase may condensate causing the fluid to become a liquid again.

In some implementations, the rate of the uniform heat transfer may be altered mechanically because the lower portion of the vapor chamber is at least one of the external surfaces of the computing device enabling mechanical communication between the vapor chamber and an ambient environment. For example, the rate of the heat transfer may be increased by forcing air over the external surfaces of the computing device using a fan or a blower. In another example, the rate of the heat transfer may be increased by positioning a heat sink on the one or more external surfaces of the computing device, where the heat sink may be configured to dissipate heat from the external surfaces of the computing device into an ambient environment.

The uniform heat transfer may enable the external surfaces of the computing device to achieve substantially isothermal external surface conditions, which may maximize a power dissipation of the computing device for a given ambient temperature. If the rate of uniform heat transfer is altered, as discussed in the example implementations above, the power dissipation may be further maximized by a power of 2, for example. Maximized power dissipation may ensure the computing device remains at or below safe temperature limits while in use, preventing performance reductions or a shutdown of the computing device.

Figure 6:
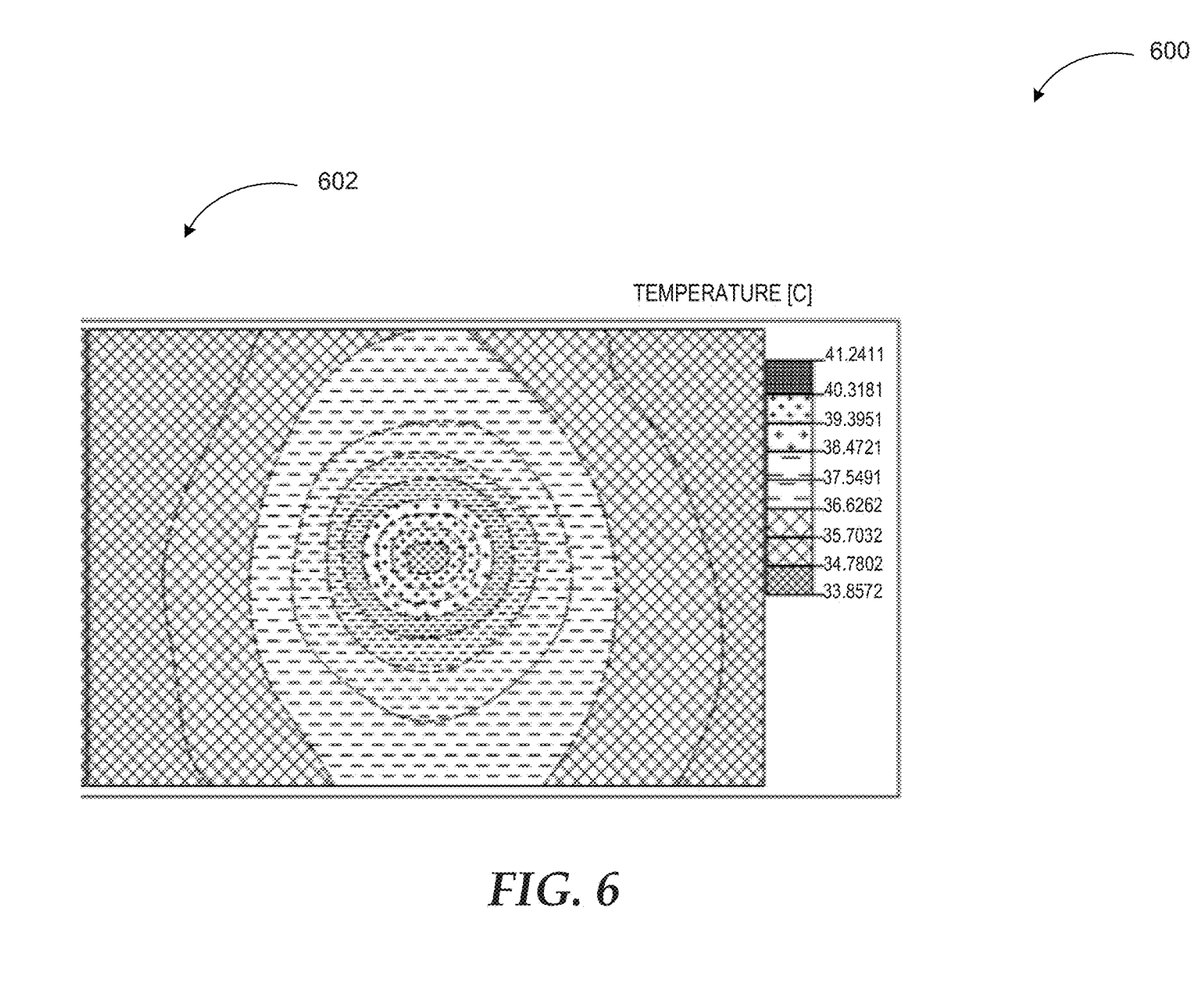
FIG. 6 illustrates an example temperature map for a vapor chamber integrated with a back case of a computing device.

FIG. 6 illustrates an example temperature map for a vapor chamber integrated with a back case of a computing device.

In diagram 600, a temperature map 602 illustrates a view of a back case of a computing device, where the back case is integrated with a vapor chamber. The back case may be configured to structurally contain computational components within the computing device, and an external surface of the back case may be at least one external surface of the computing device. The vapor chamber may include an upper portion and a lower portion that are bound though diffusion to form the vapor chamber, where the upper portion of the vapor chamber may be a metal coupled to the heat source, and the lower portion of the vapor chamber may be a portion of the back case. The vapor chamber may also include an annular space between the upper and lower portions that is evacuated and charged with a fluid following the formation of the vapor chamber.

As the vapor chamber absorbs heat from a heat source of the computing device, the fluid in the annular space of the vapor chamber may change phases from a liquid to a vapor, for example, due to an increase in temperature within the vapor chamber. The uniform heat transfer may enable the external surfaces of the computing device to achieve substantially isothermal external surface conditions, which may maximize a power dissipation of the computing device for a given ambient temperature. Maximized power dissipation may ensure the computing device remains at or below safe temperature limits while in use, preventing performance reductions or a shutdown of the computing device.

The examples in FIGS. 1 through 6 have been described with specific devices including specific device components, configurations of the components, and component tasks. Implementations are not limited to devices according to these example configurations. Providing thermal management to a computing device through an integrated vapor chamber may be implemented in configurations using other types of devices including specific device components, configurations of the components, and component tasks in a similar manner using the principles described herein.

Figure 7:
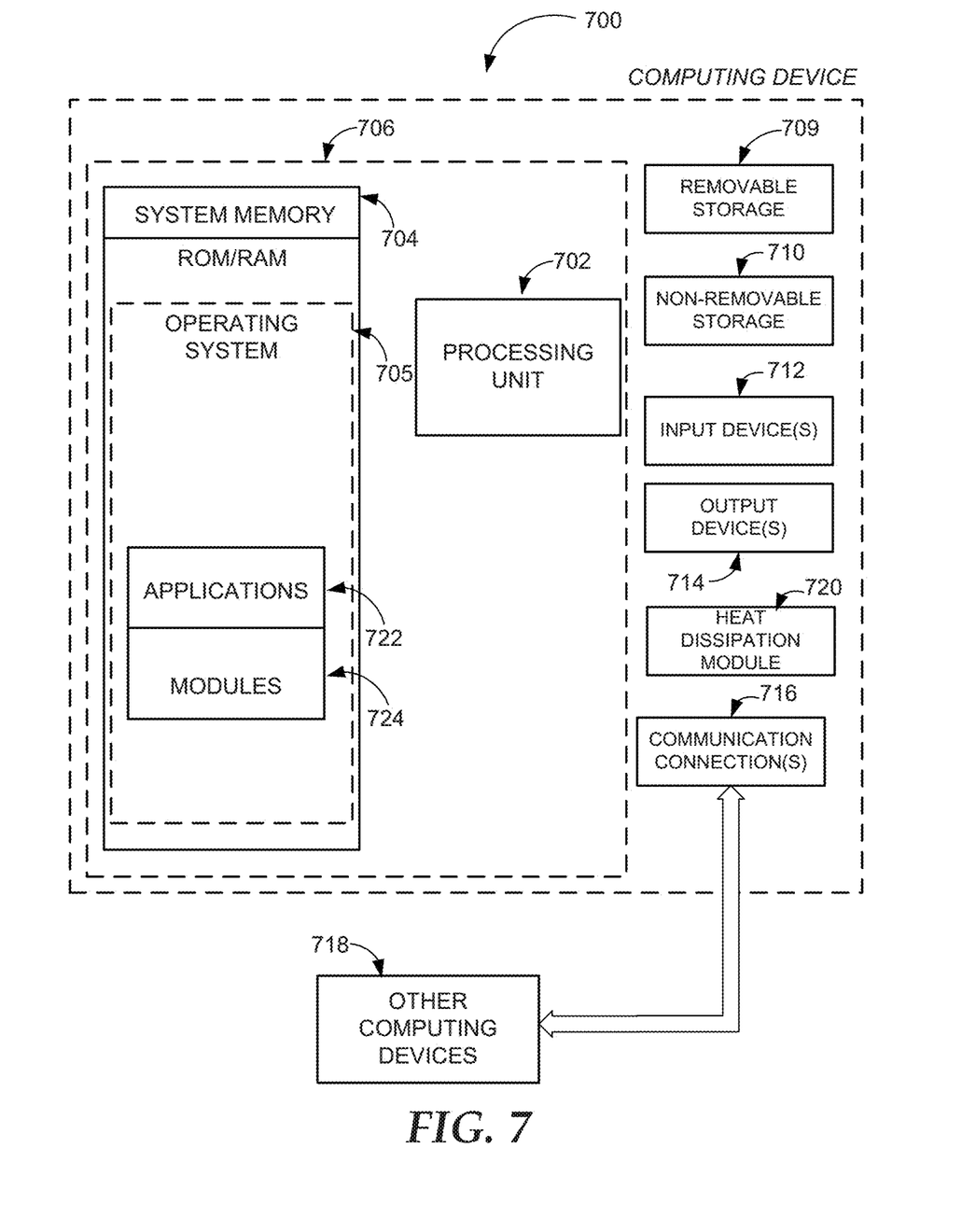
FIG. 7 is a networked environment, where a system according to implementations may be implemented.

FIG. 7 and the associated discussion are intended to provide a brief, general description of a suitable computing environment in which implementations may be implemented. With reference to FIG. 7, a block diagram of an example computing operating environment for an application according to implementations is illustrated, such as computing device 700. In a basic configuration, computing device 700 may be any portable computing device with wireless communication capabilities, which may include touch and/or gesture detection capability in some examples, and include at least one processing unit 702 and system memory 704. Computing device 700 may also include multiple processing units that cooperate in executing programs. Depending on the exact configuration and type of computing device, the system memory 704 may be volatile (such as RAM), non-volatile (such as ROM, flash memory, etc.) or some combination of the two. System memory 704 typically includes an operating system 704 suitable for controlling the operation of the platform, such as the WINDOWS®, WINDOWS MOBILE®, WINDOWS RT®, or WINDOWS PHONE®, and similar operating systems from MICROSOFT CORPORATION of Redmond, Wash. The system memory 704 may also include one or more software applications 722 that the computing device 700 may be operable to execute. In some examples the applications 722 may include one or more modules 724. The applications 722 and modules 724 may be separate applications or integrated modules of a hosted service. The basic configuration is illustrated in FIG. 7 by those components within dashed line 706.

Computing device 700 may have additional features or functionality. For example, the computing device 700 may also include additional data storage devices (removable and/or non-removable) such as, for example, magnetic disks, optical disks, or tape. Such additional storage is illustrated in FIG. 7 by removable storage 709 and non-removable storage 710. Computer readable storage media may include volatile and nonvolatile, removable and non-removable media implemented in any method or technology for storage of information, such as computer readable instructions, data structures, program modules, or other data. System memory 704, removable storage 709 and non-removable storage 710 are all examples of computer readable storage media. Computer readable storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 700. Any such computer readable storage media may be part of computing device 700. Computing device 700 may also have input deyice(s) 712 such as keyboard, mouse, pen, voice input device, touch input device, an optical capture device for detecting gestures, and comparable input devices. Output deyice(s) 714 such as a display, speakers, printer, and other types of output devices may also be included. These devices are well known in the art and need not be discussed at length here.

Some implementations may be implemented in a computing device that includes a communication module, a memory device, and a processor, where the processor executes a method as described above or comparable ones in conjunction with instructions stored in the memory device. Other implementations may be implemented as a computer readable memory device with instructions stored thereon for executing a method as described above or similar ones. Examples of memory devices as various implementations of hardware are discussed above.

Computing device 700 may also contain communication connections 716 that allow the device to communicate with other devices 718, such as over a wired or wireless network in a distributed computing environment, a satellite link, a cellular link, a short range network, and comparable mechanisms. Other devices 718 may include computer device(s) that execute communication applications, web servers, and comparable devices. Communication connection(s) 716 is one example of communication media. Communication media can include therein computer readable instructions, data structures, program modules, or other data. By way of example, and not limitation, communication media includes wired media such as a wired network or direct-wired connection, and wireless media such as acoustic, RF, infrared and other wireless media.

Computing device 700 may further be integrated with a vapor chamber configured to provide thermal management through a heat dissipation module 720. The vapor chamber may be integrated into one or more components of the computing device 700, for example. A design of the vapor chamber may enable heat absorbed by the vapor chamber to be transferred uniformly to one or more external surfaces of the computing device 700.

Example implementations also include methods. These methods can be implemented in any number of ways, including the structures described in this document. One such way is by machine operations, of devices of the type described in this document.

Another optional way is for one or more of the individual operations of the methods to be performed in conjunction with one or more human operators performing some. These human operators need not be collocated with each other, but each can be only with a machine that performs a portion of the program.

Figure 8:
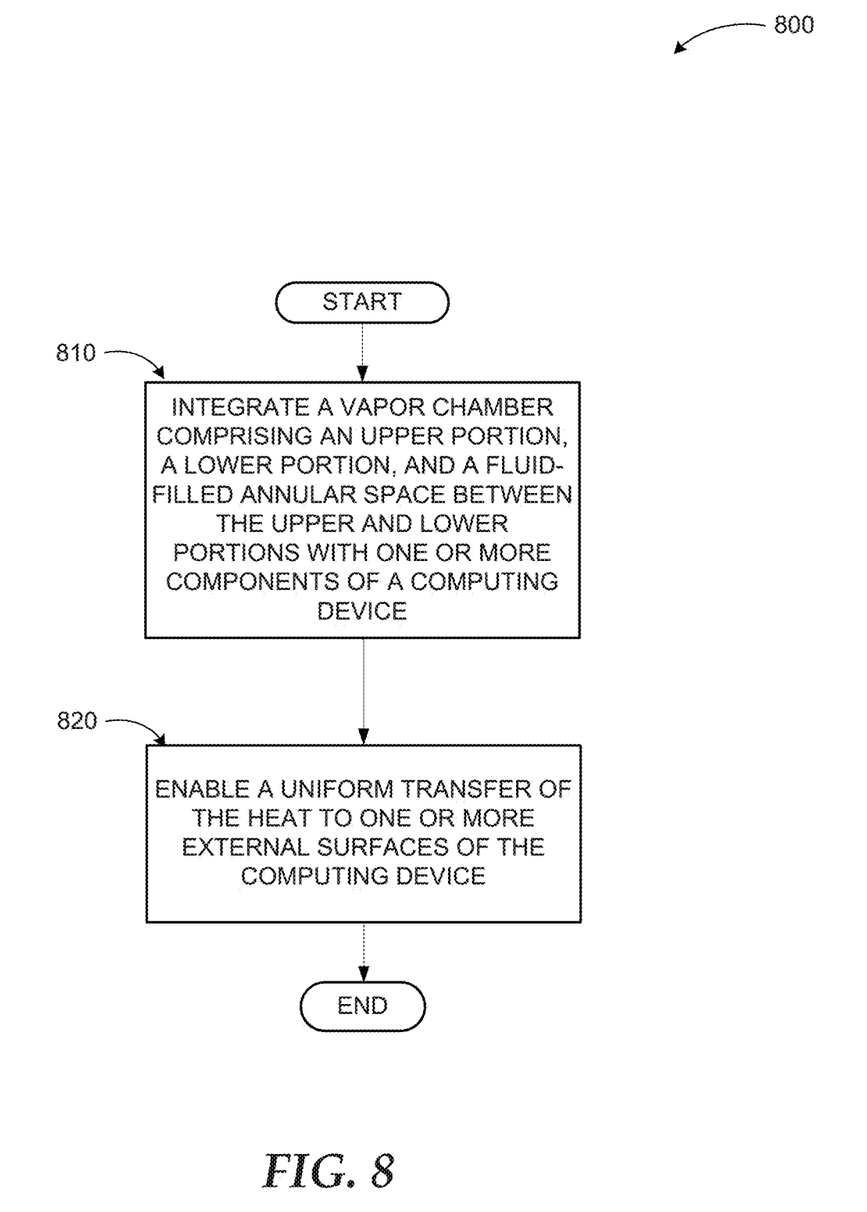
FIG. 8 illustrates a logic flow diagram of a process to provide thermal management for a computing device, according to implementations.

FIG. 8 illustrates a logic flow diagram for process 800 of a process to provide thermal management to a computing device through an integrated vapor chamber according to implementations. Process 800 may be implemented on a server or other system.

Process 800 begins with operation 810, where a vapor chamber may be integrated into one or more components of a computing device. The vapor chamber may be integrated with a TDM or a back case of the computing device, for example. The vapor chamber may include an upper portion and a lower portion forming the vapor chamber, and an annular space between the upper and lower portions that contains a fluid, such as acetone or water, dependent on a material composition of the vapor chamber.

At operation 820, the thermal conductivity may increase causing an increased rate of heat transfer. For example, the fluid in the annular space may initially be a liquid. In response to the heat, a temperature of the vapor chamber may increase, and a portion of the fluid may evaporate causing the fluid to become vapor. As the fluid evaporates from the liquid to the vapor, the viscosity of the fluid may decrease causing less resistance, the thermal conductivity may increase causing an increased rate of heat transfer, and the surface tension may decrease further causing an increased rate of heat transfer. Once the heat has been transferred from the vapor chamber to external surfaces of the computing device, the temperature of the vapor chamber may decrease, and the portion of the fluid in the vapor phase may condensate causing the fluid to become a liquid again.

In some implementations, a rate of the uniform heat transfer may be altered mechanically. In one example, the rate of the heat transfer may be increased by forcing air over the external surfaces of the computing device using a fan or a blower. In another example, the rate of the heat transfer may be increased by positioning a heat sink on the one or more external surfaces of the computing device, where the heat sink may be configured to dissipate heat from the external surfaces of the computing device into an ambient environment.

The operations included in process 800 are for illustration purposes. Providing thermal management to a computing device through an integrated vapor chamber may be implemented by similar processes with fewer or additional steps, as well as in different order of operations using the principles described herein.

According to some implementations, an apparatus configured to provide thermal management for a computing device is described. An example apparatus may include a vapor chamber configured to absorb heat from a heat source of the computing device, where the vapor chamber is integrated with a touch display module (TDM) of the computing device. The vapor chamber may include an upper portion coupled to the TDM, a lower portion coupled to the heat source, where the upper and lower portion form the vapor chamber, and an annular space between the upper and lower portions comprising a fluid.

According to other implementations, the upper portion of the vapor chamber coupled to the TDM may replace a piece of metal spanning a back side of the TDM. The vapor chamber may be configured to maintain a maximum z-axis thermal resistance due to a location of the vapor chamber in a middle section of the computing device. Phase changes of the fluid may include one of evaporation causing the fluid to change from a liquid to a vapor, and condensation causing the fluid to change from a vapor to a liquid. A portion of the fluid that is vapor may be located within a vapor layer surrounded by one or more liquid layers including a remaining portion of the fluid that is liquid.

According to further implementations, an apparatus configured to provide thermal management for a computing device may be described. An example apparatus may include a vapor chamber configured to absorb heat from a heat source of the computing device, where the vapor chamber is integrated with a back case of the computing device. The vapor chamber may include an upper portion comprising a metal coupled to the heat source, a lower portion comprising a portion of the back case, where the lower portion is bound to the upper portion of the vapor chamber through diffusion to form the vapor chamber, and an annular space between the upper and lower portions that is evacuated and charged with a fluid.

According to yet other implementations, the lower portion of the vapor chamber may be at least one of the external surfaces of the computing device enabling mechanical communication between the vapor chamber and an ambient environment. A rate of heat transfer may be increased by one of forcing air over the at least one external surface of the computing device through one of a fan and a blower. The rate of heat transfer may also be increased by employing a heat sink on the at least external surface of the computing device. The heat sink may be configured to dissipate heat from the at least one external surface of the computing device into an ambient environment.

According to some implementations, methods to provide thermal management for a computing device are described. An example method may include integrating a fluid-filled vapor chamber into one or more components of the computing device, where the vapor chamber includes an upper portion, a lower portion, and an annular space between the upper and lower portions that comprises the fluid.

According to other implementations, the vapor chamber may be integrated into one of a touch display module (TDM) and a back case of the computing device. The method may also include enabling the one or more external surfaces of the computing device to achieve substantially isothermal external surface conditions in response to the uniform heat transfer. The method may further include maximizing power dissipation of the computing device for a given ambient temperature in response to the achieving of the substantially isothermal external surface conditions.

According to further implementations, the method may also include increasing a rate of the heat transfer by one of forcing air over the one or more external surfaces of the computing device and employing a heat sink on the one or more external surfaces of the computing device. A heat source of the computing device may be a printed circuit board (PCB) of the computing device. The fluid may be dependent on a material composition of the vapor chamber. The fluid may be one or more of acetone and water. The optimized transport properties may include at least one of a dynamic viscosity, a thermal conductivity, and a surface tension of the fluid. The computing device may be a mobile device including at least one of a tablet, a smart phone, a laptop, and a gaming device.

The above specification, examples and data provide a complete description of the manufacture and use of the composition of the implementations. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims and implementations.

What is claimed is:

1. A computing device, comprising:
   a display;
   a first heat source;
   a second heat source;
   a touch display module (TDM) disposed between the display on a first side of the TDM and the second heat source on a second opposing side of the TDM, the TDM providing functionality to the display, the TDM comprising:
     an upper metallic portion spanning across the TDM and proximate to the first heat source;
     a lower portion opposite the upper metallic portion and proximate to the second heat source;
     a surrounding portion between the upper metallic portion and the lower portion; and
     a sealed space forming a vapor chamber configured to absorb heat from each of the first and second heat sources, the sealed space bounded by the upper metallic portion, the lower portion, and the surrounding portion, and disposed between the first and second heat sources; and
     the sealed space being at least partially filled with a phase change fluid,
       wherein, during operation of the computing device, the phase change fluid transitions between liquid and vapor forms to facilitate transferring heat from the first and second heat sources to one or more external surfaces of the computing device.

2. The computing device of claim 1, wherein the upper metallic portion, the lower portion and the surrounding portion replace a piece of metal spanning the second opposing side of the TDM.

3. The computing device of claim 1, wherein a phase change of the phase change fluid include one of:
   evaporation causing the phase change fluid to change from a liquid to a vapor, or
   condensation causing the phase change fluid to change from the vapor to the liquid.

4. The computing device of claim 3, wherein a portion of the phase change fluid that is the vapor is located within a vapor layer surrounded by one or more liquid layers comprising a remaining portion of the phase change fluid that is the liquid.

5. The computing device of claim 1, wherein a rate of heat transfer is increased by forcing air over the one or more external surfaces of the computing device through one of a fan and a blower.

6. The computing device of claim 5, wherein the rate of heat transfer is increased by employing a heat sink on the one or more external surfaces of the computing device.

7. The computing device of claim 6, wherein the heat sink is configured to dissipate the heat from the one or more external surfaces of the computing device into an ambient environment surrounding the computing device.

8. The computing device of claim 1, wherein the sealed space forming the vapor chamber is located in a center of the computing device.

9. The computing device of claim 1, wherein the upper metallic portion spans at least one dimension of the computing device.

10. The computing device of claim 1, wherein the computing device is a wearable device.

11. The computing device of claim 1, wherein the computing device is maintained at a safe temperature during the operation of the computing device.

12. The computing device of claim 1, wherein a plurality of the one or more external surfaces radiate the heat away from the computing device.

13. The computing device of claim 1, wherein the upper metallic portion spans an entirety of the TDM.

14. The computing device of claim 1, wherein the upper metallic portion is aluminum.

15. The computing device of claim 1, further comprising:
   a back case structurally containing computational components within the computing device.

16. The computing device of claim 1, wherein the functionality provided by the TDM to the display is electrical touch display functionality.

17. A computing device comprising:
   a display;
   a first heat source;
   a second heat source;
   a touch display module (TDM) disposed between the display on a first side of the TDM and the second heat source on a second opposing side of the TDM, the TDM providing functionality to the display, the TDM comprising:
     an upper aluminum portion spanning across the TDM and proximate to the first heat source;
     a lower portion opposite the upper aluminum portion and proximate to the second heat source;
     a surrounding portion between the upper aluminum portion and the lower portion;
   and
     a sealed space forming a vapor chamber configured to absorb heat from each of the first and second heat sources, the sealed space bounded by the upper aluminum portion, the lower portion, and the surrounding portion, and disposed between the first and second heat sources; and
     the sealed space being at least partially filled with a phase change fluid,
       wherein, during operation of the computing device, the phase change fluid transitions between liquid and vapor forms to facilitate transferring heat from the first and second heat sources to one or more external surfaces of the computing device.

18. The computing device of claim 17, wherein the upper aluminum portion spans an entirety of the lower portion of the TDM.

* * * * *